(12) United States Patent
Freer et al.

(10) Patent No.: US 7,435,977 B2
(45) Date of Patent: Oct. 14, 2008

(54) ION BEAM ANGLE MEASUREMENT SYSTEMS AND METHODS FOR ION IMPLANTATION SYSTEMS

(75) Inventors: Brian S. Freer, Medford, MA (US); Alexander S. Perel, Danvers, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 352 days.

(21) Appl. No.: 11/299,593

(22) Filed: Dec. 12, 2005

(65) Prior Publication Data

US 2007/0145298 A1 Jun. 28, 2007

(51) Int. Cl.
*H01J 37/08* (2006.01)
(52) U.S. Cl. ............... 250/492.21; 250/397; 250/492.2; 250/492.3; 250/423 R; 250/396 R
(58) Field of Classification Search ............ 250/492.21, 250/492.2, 492.1, 397, 423 R, 492.3, 396 R
See application file for complete search history.

(56) References Cited

U.S. PATENT DOCUMENTS

| | | | |
|---|---|---|---|
| 3,778,626 A | 12/1973 | Robertson | |
| 4,276,477 A | 6/1981 | Enge | |
| 4,745,287 A | 5/1988 | Turner | |
| 5,483,077 A * | 1/1996 | Glavish | 250/492.2 |
| 6,255,662 B1 * | 7/2001 | Rubin et al. | 250/492.21 |
| 6,677,598 B1 * | 1/2004 | Benveniste | 250/492.21 |
| 6,777,695 B2 | 8/2004 | Viviani | |
| 6,828,572 B2 * | 12/2004 | Reece et al. | 250/492.21 |

(Continued)

FOREIGN PATENT DOCUMENTS

JP 2003-229087 A 8/2003

(Continued)

OTHER PUBLICATIONS

"In situ beam angle measurement in a multi-wafer high current ion implanter", B.S. Freer, R.N. Reece, M.A. Graf, T. Parrill and D. Polner, Nuclear Instruments & Methods in Physics Research, Section B: Beam Interactions with Materials and Atoms, Elsevier, Amsterdam, NL, vol. 237, No. 1-2, Aug. 2005, 6 pgs.

(Continued)

*Primary Examiner*—Jack I. Berman
*Assistant Examiner*—Michael J Logie
(74) *Attorney, Agent, or Firm*—Eschweiler & Associates, LLC

(57) ABSTRACT

Angle of incidence measurements along an axis of ion implantation are obtained by employing positive and negative slot structures. The positive slot structures have entrance openings, exit openings, and slot profiles there between that obtain portion(s) of an ion beam having a selected range of angles in a positive direction. The negative slot structures have entrance openings, exit openings, and slot profiles there between that obtain portion(s) of the ion beam having the selected range of angles in a negative direction. A first beam measurement mechanism measures beam current of the positive portion to obtain a positive angle beam current measurement. A second beam measurement mechanism measures beam current of the negative portion to obtain a negative angle beam current measurement. An analyzer component employs the positive angle beam current measurement and the negative angle beam current measurement to determine a measured angle of incidence.

23 Claims, 11 Drawing Sheets

U.S. PATENT DOCUMENTS

| | | | |
|---|---|---|---|
| 6,872,953 B1* | 3/2005 | Benveniste | 250/397 |
| 7,202,483 B2* | 4/2007 | Olson et al. | 250/397 |
| 2002/0121889 A1* | 9/2002 | Larsen et al. | 324/71.3 |
| 2003/0197132 A1* | 10/2003 | Keum et al. | 250/492.21 |
| 2004/0149926 A1* | 8/2004 | Purser et al. | 250/397 |
| 2004/0195528 A1* | 10/2004 | Reece et al. | 250/492.21 |
| 2004/0262533 A1* | 12/2004 | Krueger | 250/397 |
| 2005/0082498 A1 | 4/2005 | White | |
| 2005/0211924 A1* | 9/2005 | Shibata et al. | 250/492.21 |
| 2005/0247889 A1* | 11/2005 | Yoon | 250/491.1 |
| 2005/0253098 A1 | 11/2005 | Petersen et al. | |
| 2006/0006346 A1* | 1/2006 | Rathmell et al. | 250/492.21 |
| 2006/0113493 A1 | 6/2006 | Kabasawa et al. | |
| 2006/0113494 A1 | 6/2006 | Chen et al. | |
| 2006/0219936 A1 | 10/2006 | Olson et al. | |
| 2006/0219955 A1* | 10/2006 | Ray | 250/492.21 |
| 2006/0289798 A1 | 12/2006 | Cummings et al. | |
| 2007/0138412 A1 | 6/2007 | Freer | |
| 2007/0145298 A1 | 6/2007 | Freer et al. | |

FOREIGN PATENT DOCUMENTS

| | | | |
|---|---|---|---|
| JP | 2003229087 A | * | 8/2003 |
| WO | WO 2004/097881 A2 | | 11/2004 |

OTHER PUBLICATIONS

International Search Report, Int'l Application No. PCT/US2006/047330, Int'l Filing Date Dec. 12, 2006, 3 pgs.

"The Extrion 220 Parallel Scan Magnet", R.E. Kaim and P.F.H.M. Van Der Meulen, Nuclear Instruments and Methods in Physics Research B55, Section B, Beam Interactions with Materials and Atoms, Elsevier, Amsterdam, NL, vol. B55, No. 1/4, Apr. 2, 1991, pp. 453-456.

"In-Situ Ion Beam Profiling by Fast Scan Sampling", P. Splinter, F. Sinclair, N. Demario, W. Reed, J. Castintini, D. Shen, J. Burgess and P. Ring, Ion Implantation Technology, Proceedings of the 11th International Conference in Austin, TX, Jun. 1996, pp. 272-275.

International Search Report, Int'l Application No. PCT/US2006/048937, Int'l Filing Date Dec. 20, 2006, 3 pgs.

Office Action dated Jan. 29, 2008 in connection with U.S. Appl. No. 11/313,319.

Response to Office Action dated Jan. 29, 2008 in connection with U.S. Appl. No. 11/313,319.

* cited by examiner

POSITIVE ANGLE DIRECTION

ION BEAM ANGLE MEASUREMENT SYSTEMS AND METHODS FOR ION IMPLANTATION SYSTEMS

FIELD OF INVENTION

The present invention relates generally to semiconductor device fabrication and ion implantation, and more particularly, to calibrating, detecting and/or modifying an ion beam incident angle, directionally, during setup or in situ.

BACKGROUND OF THE INVENTION

Ion implantation is a physical process that is employed in semiconductor device fabrication to selectively implant dopant into semiconductor and/or wafer material. Thus, the act of implanting does not rely on a chemical interaction between a dopant and semiconductor material. For ion implantation, dopant atoms/molecules are ionized, accelerated, formed into a beam, analyzed, and swept across a wafer, or the wafer is swept through the beam. The dopant ions physically bombard the wafer, enter the surface and come to rest below the surface, at a depth related to their energy.

An ion implantation system is a collection of sophisticated subsystems, each performing a specific action on the dopant ions. Dopant elements, in gas or solid form, are positioned inside an ionization chamber and ionized by a suitable ionization process. In one exemplary process, the chamber is maintained at a low pressure (vacuum). A filament is located within the chamber and is heated to the point where electrons are created from the filament source. The negatively charged electrons are attracted to an oppositely charged anode also within the chamber. During the travel from the filament to the anode, the electrons collide with the dopant source elements (e.g., molecules or atoms) and create a host of positively charged ions from the elements in the molecule.

Generally, other positive ions are created in addition to desired dopant ions. The desired dopant ions are selected from the ions by a process referred to as analyzing, mass analyzing, selection, or ion separation. Selection is accomplished utilizing a mass analyzer that creates a magnetic field through which ions from the ionization chamber travel. The ions leave the ionization chamber at relatively high speeds and are bent into an arc by the magnetic field. The radius of the arc is dictated by the mass of individual ions, speed, and the strength of the magnetic field. An exit of the analyzer permits only one species of ions, the desired dopant ions, to exit the mass analyzer.

An acceleration system is employed to accelerate or decelerate the desired dopant ions to a predetermined momentum (e.g., mass of an dopant ion multiplied by its velocity) to penetrate the wafer surface. For acceleration, the system is generally of a linear design with annular powered electrodes along its axis. As the dopant ions enter therein, they are accelerated therethrough.

However, a number of potential problems can occur during ion implantation procedures that can damage and/or destroy semiconductor devices being fabricated. One potential problem encountered during ion implantation is an unacceptable degree of electrical charging (wafer charging) of the wafer surface. For example, an ion beam can carry excessive positive charges that charge or buildup on a wafer surface. The positive charge can draw neutralizing electrons from the surface, the bulk, the beam, structures, layers, and the like and degrade or destroy such components. Additionally, excessive charge buildup can cause voltages and/or current to be applied to semiconductor device components in an uncontrolled manner thereby damaging the device components.

Another potential problem encountered during ion implantation is an incorrect angle of implantation. Generally, an ion implantation is performed at a specific angle with respect to a wafer surface. If a calibration error or angular error is present (e.g., process equipment is not calibrated properly) the ion implantation can be performed at a different angle, location and/or depth than intended. Such errors can undesirably modify the implantation profile, fail to dope certain areas, implant dopants into unintended areas, damage device structures, dope to an incorrect depth, and the like.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention facilitates semiconductor device fabrication by detecting or measuring angle of incidence values for incident ion beams and optionally correcting angular errors before and/or during ion implantation procedures. The present invention employs slot arrays comprised of structures having one or more slots defined therein. The slot arrays select positive and negative portions of an incident ion beam, which are then measured to obtain positive and negative angle beam current measurements. An angle of incidence value, such as an average or median angle of incidence, can be determined from the obtained positive and negative angle beam current measurements. Alternately, adjustments in the ion implantation process or system can be made to balance the positive and negative angle beam current measurements so that, for example, they are about equal.

The slots within the slot arrays are shaped such that angles less than, for example, about zero are blocked while a selected range of angles in a particular direction are permitted to pass. Then, a portion of an ion beam passes through the slots and is measured to obtain beam current in the particular direction. Other slot arrays are present with slots that also block angles less than, for example, zero while permitting angles of the selected range to pass, but in a direction opposite the particular direction. Another portion of the ion beam passes through the other slot arrays and is measured to obtain beam current in an opposite direction. This permits beam current measurements in opposite directions to be obtained and allows determination of a measured angle of incidence.

In accordance with an aspect of the present invention, angle of incidence measurements along an axis of ion implantation are obtained by employing positive and negative slot structures. The positive slot structures have entrance openings, exit openings, and slot profiles there between that obtain portion(s) of an ion beam having a selected range of angles in a positive direction. The negative slot structures have entrance openings, exit openings, and slot profiles there between that obtain portion(s) of the ion beam having the selected range of angles in a negative direction. A first beam measurement mechanism measures beam current of the positive portion to obtain a positive angle beam current measurement. A second beam measurement mechanism measures beam current of the negative portion to obtain a negative angle beam current measurement. Alternately, a single beam measurement mechanism can obtain measurements at different times. An analyzer component employs the positive angle beam current measurement and the negative angle beam current measurement to determine a measured angle of incidence. Other systems, methods, and detectors are also disclosed.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1A:
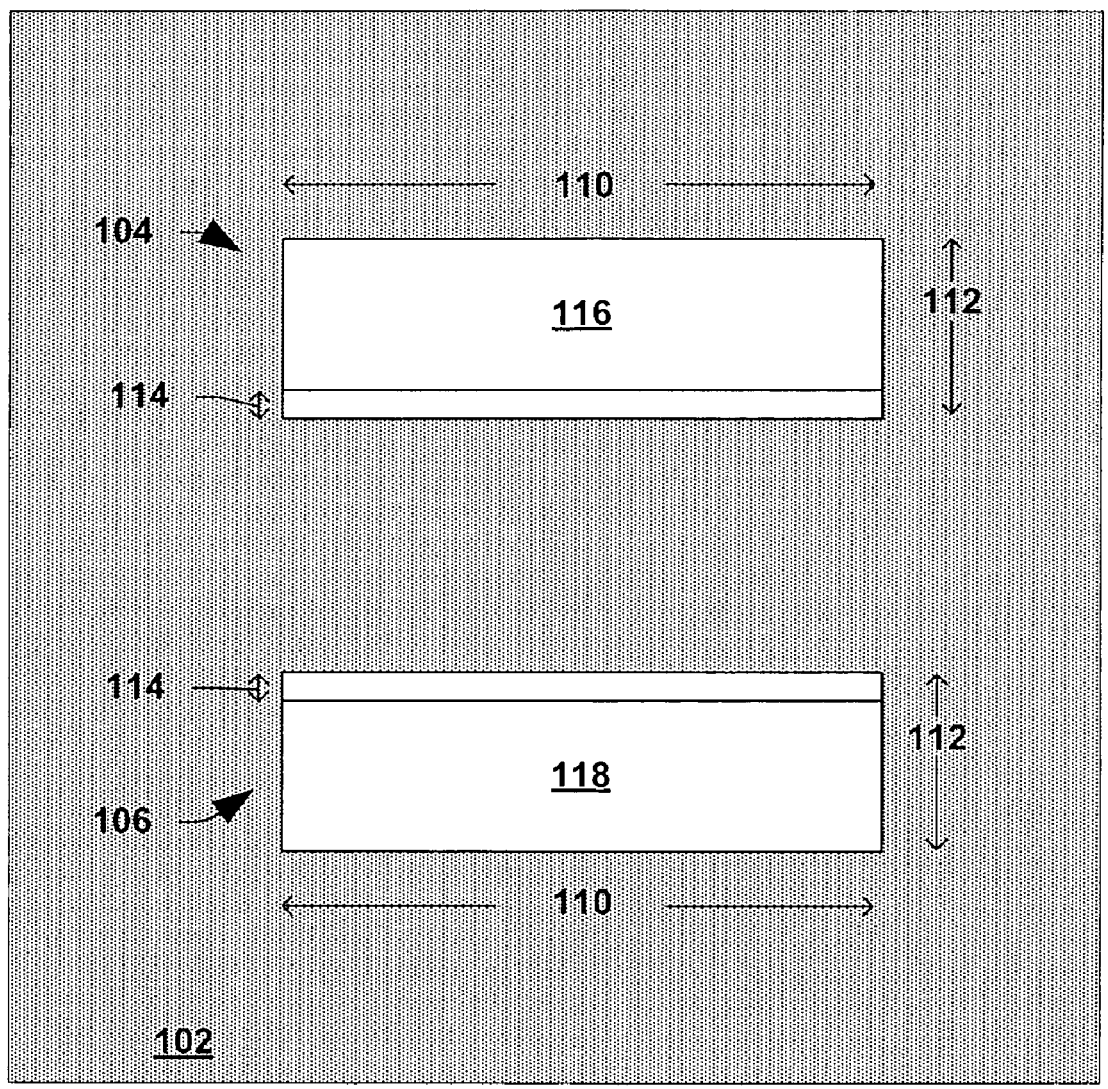
FIG. 1A is a top view of the angle detector in accordance with an aspect of the present invention.

The present invention will now be described with reference to the attached drawings, wherein like reference numerals are used to refer to like elements throughout. It will be appreciated by those skilled in the art that the invention is not limited to the exemplary implementations and aspects illustrated and described hereinafter.

The present invention facilitates semiconductor device fabrication and ion implantation by detecting or measuring angle of incidence values for incident ion beams and optionally correcting angular errors before and/or during ion implantation procedures. The present invention employs slot arrays comprised of structures having one or more slots defined therein. The slot arrays select positive and negative portions of an incident ion beam, which are then measured to obtain positive and negative angle beam current measurements. An angle of incidence value, such as an average or median angle of incidence, can be determined from the obtained positive and negative angle beam current measurements. Alternately, adjustments in the ion implantation process or system can be made to balance the positive and negative angle beam current measurements so that, for example, they are about equal.

Figure 1B:
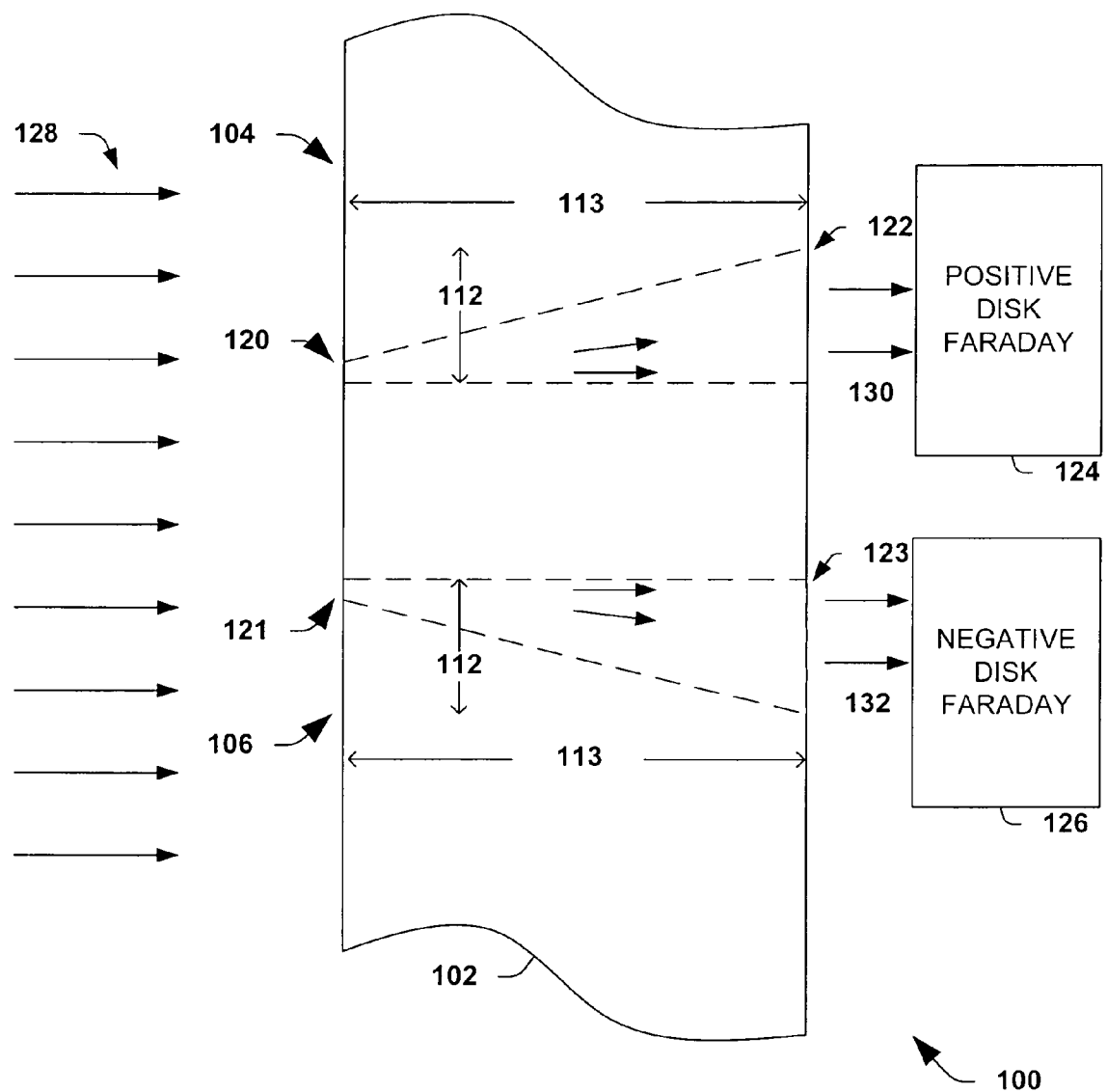
FIG. 1B is a cross sectional side view of the ion beam angle detector in accordance with an aspect of the present invention.

FIGS. 1A and 1B depict an ion beam incident angle detector 100 in accordance with an aspect of the present invention. The angle detector 100 is operable to measure and determine angle of incidence values for an incident ion beam in a first and second direction. The angle detector 100 can be employed in both single and batch ion implantation systems. Also, the angle detector 100 can be employed on its own or with additional angle detectors. Additionally, the angle detector 100 can be employed for setup, calibration, and/or during ion implantation to correct and/or select suitable ion implantation angles.

FIG. 1A is a top view of the angle detector 100 in accordance with an aspect of the present invention. The view is provided for illustrative purposes and is not intended to limit the present invention. Other configurations of angle detectors are permitted in accordance with the present invention.

The angle detector 100 comprises a structure 102 having a first slot 104 and a second slot 106 defined there through. The first slot 104 and the second slot 106 are not typically symmetrical and the first slot can also be referred to as or part of a first asymmetric mask and the second slot 106 can also be referred to as or part of a second asymmetric mask. The first slot 104 passes only a first portion in a first direction of an incident ion beam and the second slot 106 passes only a second portion in a second direction of the incident ion beam. The second direction is opposite that of the first direction.

The structure 102 is typically comprised of a conductive material such as a metal (e.g., aluminum) and is connected to ground. Alternately, the structure 102 can be biased to some other voltage value and still be in accordance with the present invention.

The first slot 104 and the second slot 106 have a length 110 and a width 112. Typically, the length 110 is sufficient to completely include an incident ion beam. Alternately, the length 110 can be less, but may require sweeping the beam through the slots 104 and 106, sweeping the slots 104 and 106 through the beam, or an array of slots (not shown) in order to measure the incident angles of the beam. The first slot 104 has a blocked portion 116 that limits or prevents passage of a portion of the ion beam there through. An open portion having a width 114 allows ions within a selected range of incident angles to pass there through. Similarly, the second slot 106 has a blocked portion 118 that limits or prevents passage of another portion of the ion beam there through. An open portion has the same width 114 and allows ions from the ion beam within a selected range of incident angles to pass there through.

The detector 100 typically samples the entire beam in both dimensions to obtain a suitable representation of the entire beam. However, it is appreciated that alternate aspects can measure only a subset of the entire beam, for example, so as to determine an angle for a center of a beam. The slots 104 and 106 can be of a variety of suitable shapes and sizes. The slots 104 and 106 can be long in one dimension to provide coverage of an entire height of a beam, but swept across a width of the beam. Alternately, the slots 104 and 106 can be smaller in both dimensions than an ion beam requiring sweeping of the beam or slots in both dimensions. Other variations in sizes of slots and numbers of slots employed are contemplated in alternate aspects of the invention.

FIG. 1B is a cross sectional side view of the ion beam angle detector 100 in accordance with an aspect of the present invention. Here, an incident ion beam 128 is depicted passing through the angle detector 100.

The first slot 104 is shown with an entrance opening or aperture 120 and an exit opening 122. The first slot 104 has a slot profile defined between the entrance opening 120 and the exit opening 122 and has a height 113. The size and shape of the entrance opening 120, the size and shape of the exit opening 122, and a profile of the slot there between determine a first selected range of angles for which ions of the ion beam 128 may pass through. Generally, angles less than zero are blocked. However, other blocking angles, such as +3 degrees or −5 degrees, can also be employed. The first slot 104, as an example, is depicted in FIG. 1B as having a linear or straight slot profile from the entrance opening 120 to the exit opening 122. A height of the first slot 104 is shown as 113.

The second slot 106 is also shown with an entrance opening 121 and an exit opening 123. The second slot 106 has a slot profile defined between the entrance opening 121 and the exit opening 123 and has the height 113. The size and shape of the entrance opening 121, the size and shape of the exit opening 123, and a profile of the slot there between determine a second selected range of angles for which ions of the ion beam 128 may pass through. The second slot 106, as an example, is depicted in FIG. 1B as having a linear or straight slot profile from the entrance opening 121 to the exit opening 123. A height of the second slot 106 is also shown as 113.

It is noted that ranges of angles and subsequent measurements are also referred to as positive and negative angles in order to facilitate understanding of the present invention. However, it is noted that such terminology is not restricted to only positive or negative angles.

A first charge measurement device 124, such as a faraday, biased pickup, and the like, measures beam current for a first portion 130 of the ion beam 128 according to the first selected range of angles. The first charge measurement device 124 is positioned adjacent to or at a distance downstream from the exit opening 122 of the first slot 104.

A second charge measurement device 126 measures beam current for a second portion 132 of the ion beam 128 according to the second selected range of angles. The second charge measurement device 126 is positioned adjacent to are at a distance downstream from the exit opening 123 of the second slot 106. It is noted that in alternate aspects of the invention, a single charge measurement device can be employed to obtain both measurements by obtaining the measurements at slightly different times.

A first measurement obtained by the first charge measurement device 124 indicates or represent beam current in a first direction. A second measurement obtained by the second charge measurement device 126 indicates or represents beam current in a second direction, which is opposite the first.

An analyzer component (not shown) can determine an average or median angle of incidence value(s) for the incident ion beam 128 according to the first and second measurements. The analyzer component (not shown) can, for example, be comprised of a processor based system or logic circuit that receives the first and second beam current measurements and determines the angle of incidence value. The analyzer component (not shown) can employ the size and shapes of the entrance openings 120 and 121, the size and shapes of the exit openings 122 and 123, the slot profiles for the first and second slots 104 and 106, the heights 113 of the slot profiles, and the like in order to determine the angle of incidence value(s).

Additionally, in one example, the analyzer component can determine values such as the first beam current measurement subtracted by the second beam current measurement and then divided by the total measured beam current and then correlate the determination with an angle of incidence value. As another example, the analyzer component can determine a values such as the first beam current measurement divided by the second beam current measurement and then correlate the determination with an angle of incidence value. As yet another example, the analyzer component can determine values such as the first beam current measurement subtracted by the second beam current measurement and then divided by a sum of the first beam current measurement and the second beam current measurement and then correlate the determination with an angle of incidence value.

The angle of incidence value(s) can then be employed as feedback and used to correct and/or adjust the ion beam 128. For example, the beam 128 can be adjusted with respect to a target device, the target device can be adjusted with respect to the beam 128, or both in order to obtain a desired angle of incidence of the ion beam 128 with respect to the target device.

Figure 2:
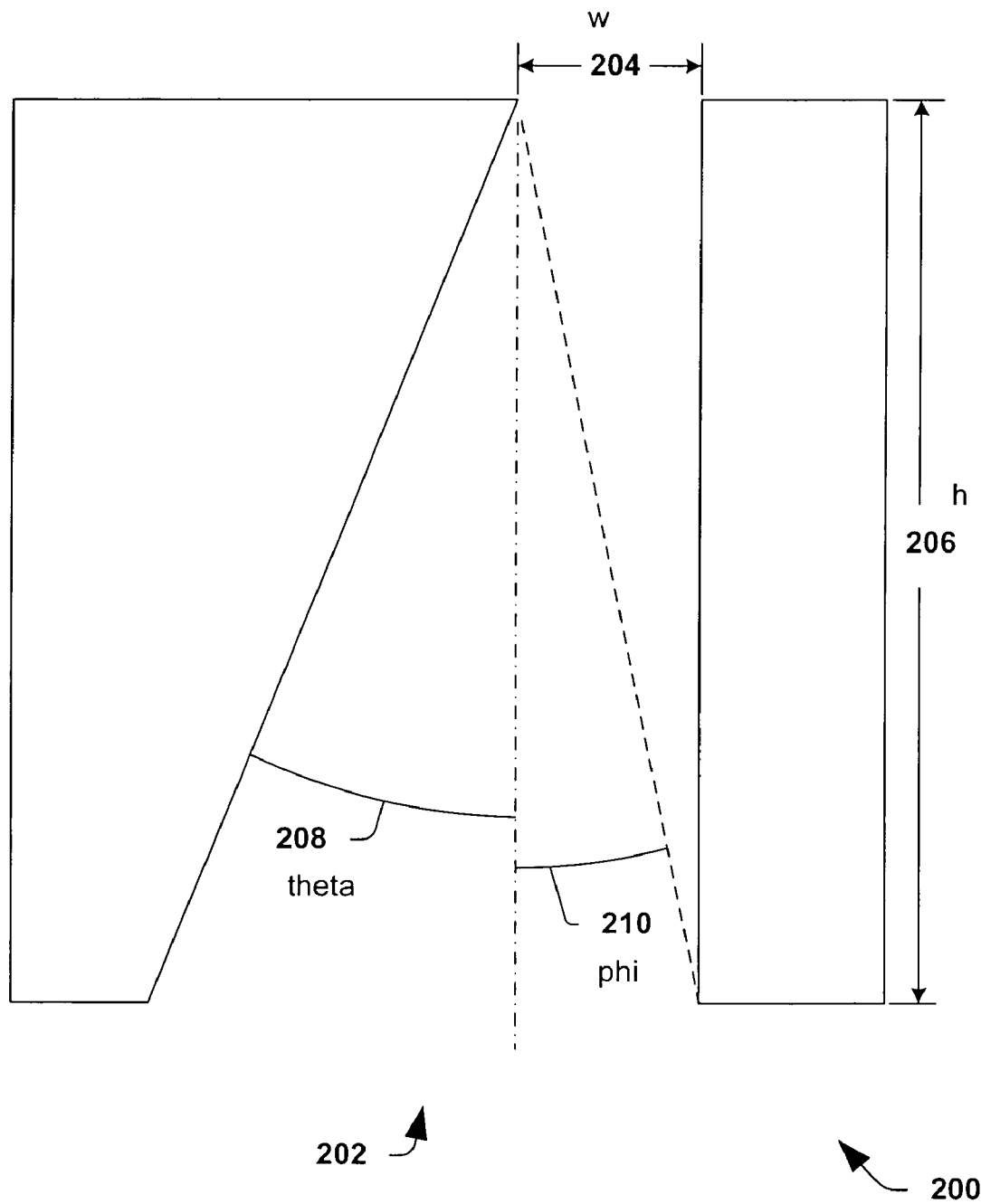
FIG. 2 is a cross sectional view of an exemplary slot structure for selecting a portion of an incident ion beam according to a selected range of angles in accordance with an aspect of the present invention.

FIG. 2 is a cross sectional view of an exemplary slot structure 200 for selecting a portion of an incident ion beam according to a selected range of angles in accordance with an aspect of the present invention.

The structure 200 includes a slot 202 formed therein with an entrance opening 212 and an exit opening 214. The slot 202 can comprise an asymmetric mask itself or in combination with other slots. In operation, the selected portion of the incident ion beam enters the entrance opening 212 and subsequently exits the slot 202 through the exit opening 214. Subsequently, a beam current measurement device (not shown) measures beam current of the selected portion of the ion beam. The beam current measurement device (not shown) is positioned downstream of the slot 202. It is noted that the direction of propagation can be reversed, thereby entering the exit opening 214 and exiting through the entrance opening 212 instead and still be in accordance with the present invention.

The slot 202 has a minimum width 204 and a height 206. Typically, the aspect ratio, which is height/width should be greater than 1 and yield an acceptance angle phi 210, which is equal to arctan (width/height). The acceptance angle phi 210 is generally not much greater than a maximum expected angular spread of an incident ion beam, consistent with an adequate signal-to-noise ratio. The acceptance angle is a cutoff angle, where if the beam is parallel and is coming in at an angle greater relative to the normal of the slot opening, no beam goes through the slot. The angle phi 210 can also be smaller than or about equal to the angular spread of the incident ion beam. As an example, a slot having an aspect ratio 13.3 to 1 has a cutoff angle of about +/−4.3 degrees. An asymmetric angle theta 208 is typically greater than or about equal to a maximum angle between the ion beam and the detector (not shown) and is also greater than the acceptance angle phi 210.

Figure 3:
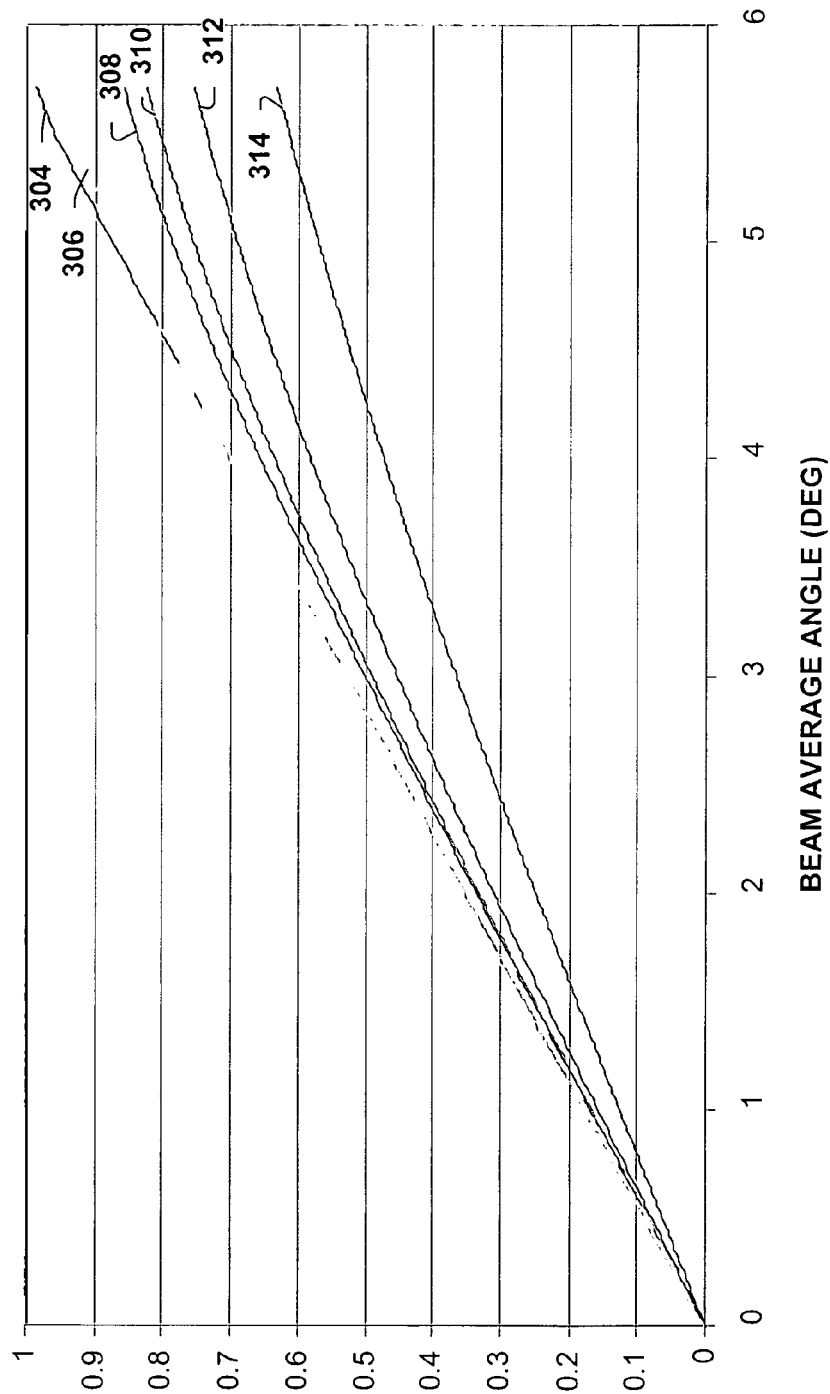
FIG. 3 is a graph illustrating a beam current difference for pairs of slots in accordance with an aspect of the present invention.

FIG. 3 is a graph 300 illustrating a beam current difference for pairs of slots in accordance with an aspect of the present invention. Positive slot(s), such as shown in FIG. 2 and FIGS. 1A to 1B select a first portion of an incident ion beam with a positive range of angles. Negative slots select a second portion of the incident ion beam with a negative range of angles. Positive angle beam current is measured for the positive slot (s) and negative angle beam current is measured for the negative slot(s), such as by using one or more Faraday cups.

The positive and negative slots have an aspect ratio, height divided by width, of about 10 to 1. These slots can measure angle offset, for a given angular spread, for up to 5 or more degrees. However, angular spread of a beam is not always known. For an angular spread from 0.2 to 3 degrees, as an example, it can be seen from FIG. 3 that if the (pos-neg)/total=0.5, the angle can be estimated to be 3 degrees +/−0.2 degrees.

The graph 300 depicts beam average angle in degrees on an x-axis and depicts a measured current ratio on a y-axis. The measured current ratio, in this example, is equal to a difference between the positive and negative measured beam currents divided by a total beam current incident on positive and negative slots.

A first line 304 depicts beam average angle for an incident ion beam having about a 0.20 degree beam spread angle. A second line 306 depicts beam average angle for another incident ion beam having about a 0.70 degree beam spread angle. A third line 308 depicts beam average angle for an incident ion beam having about a 1.50 degree beam spread angle. A fourth line 310 depicts beam average angle for yet another incident ion beam having about a 2.00 degree beam spread angle. A fifth line 312 depicts beam average angle for another incident ion beam having about a 3.00 degree beam spread angle. A sixth line 314 depicts beam average angle for another incident ion beam having about a 5.00 degree beam spread angle.

The graph 300 demonstrates, in this example, that a 10.0 to 1 aspect ratio allows beam angles of up to 3 degrees to be measured within 0.2 degree for beam spreads up to 2 degrees. It is appreciated that the present invention contemplates other aspect ratios and can be employed with ion beams having other beam spread angles than those described above.

Figure 4:
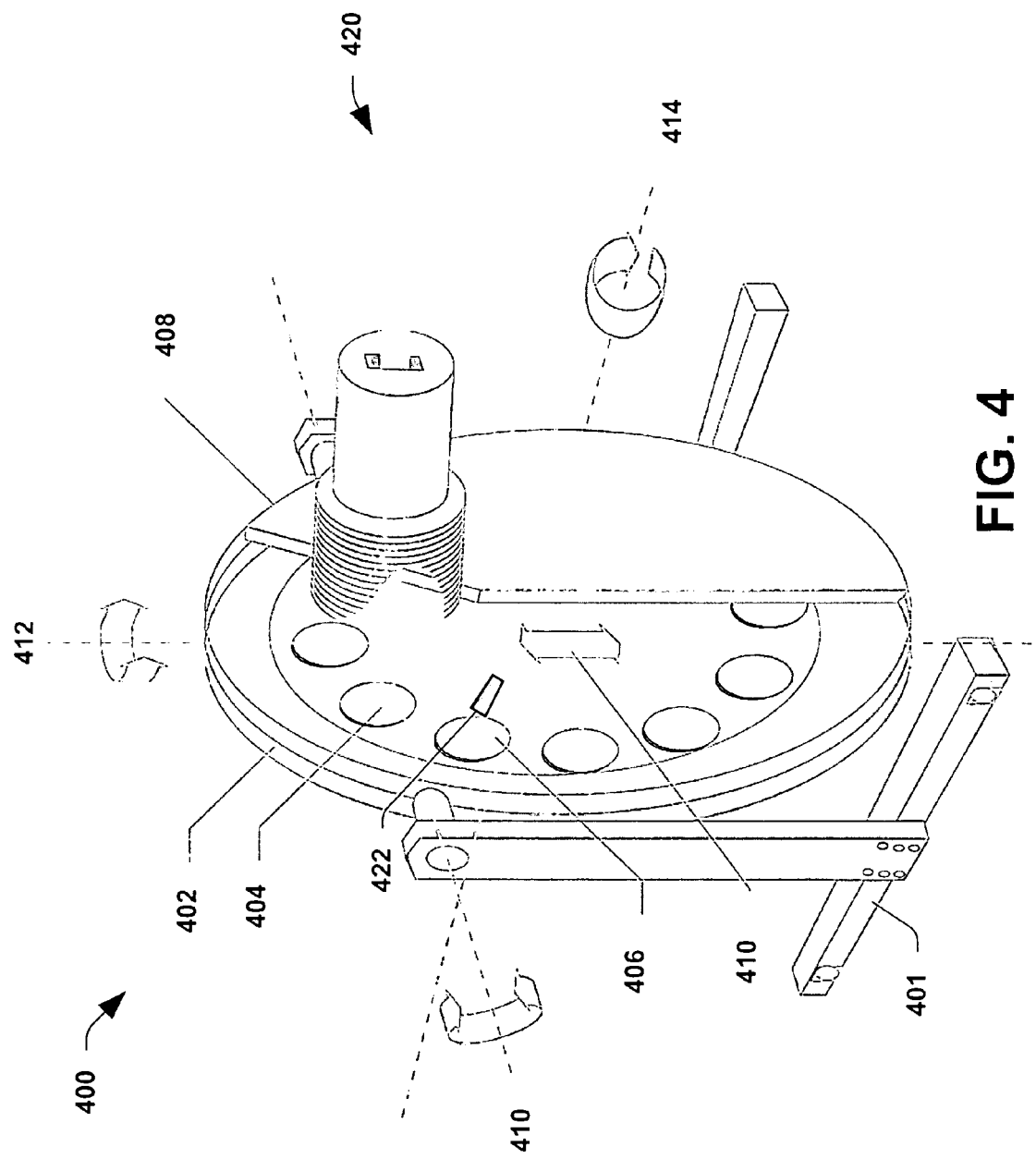
FIG. 4 is a perspective view of an exemplary end station for an ion implantation device in accordance with an aspect of the present invention.

Continuing on with FIG. 4, a perspective view of an exemplary end station 400 for an ion implantation device is depicted in accordance with an aspect of the present invention. The end station 400 is operable to be calibrated and adjusted in situ in accordance with the present invention. The end station 400 permits and performs substantially accurate ion implantation procedures therein facilitating semiconductor device fabrication.

The end station 400 typically includes a process chamber 402 and a chamber mount 401, which support the process chamber 402. The process chamber 402 comprises a process disk 404 that holds a number of wafers 406 and flexible stainless bellows 408 allow the end station to about one or more axis with respect to the ion beam. The wafers 406 are located on the process disk within a scan/process area or region in which an ion beam can pass into during an implantation procedure. The process disk 404 is rotatable about orthogonal axes 410, 412 (an alpha axis and a beta axis) that are related to process disk tilt and twist. During operation of a typical ion implantation process, the process disk rotates about an axis of rotation 414 at speeds that can vary upon the particular device being fabricated and the ion implantation being performed. An exemplary rotational speed is 1200 rotations per minute (rpm), however other suitable rotational speeds can be employed and still be in accordance with the present invention. During operation of an ion implantation process, an ion beam 420 is scanned across the process disk 404 in a vertical direction 410. Thus, the ion beam 420 is swept across the wafers 406, which are located in the area scanned by the ion beam.

The process disk 404 additionally includes one or more slot arrays 422, also referred to as asymmetric masks, that permit beamlets of the ion beam 420 to pass there through according to a range of selected angles and a direction. A beam current measurement device(s) (not shown), such as a Faraday cup, measures the beam current for the beamlets that pass through the one or more slot arrays 422. The beam current measurement device(s) along with the slot arrays 422 operate as directional angle detectors. The measured beam current or charge is a function of the ion beam's 420 angle with respect to the process disk in a positive or negative direction.

The slot arrays 422 can be located within the scan area or, alternately, can be located in an area reachable by the ion beam 420 but outside of the typical scan/process area. Typically, but not necessarily, a portion of the slot arrays 422 are designated positive and permit measurement of charge or beam current for the selected angles in a positive direction. Similarly, another portion of the slot arrays 422 are designated negative and permit measurement of charge or beam current for the selected angles in a negative direction. As a result, the negative and positive measurements can be compared or otherwise analyzed in order to determine a direction of the ion beam 420.

Semiconductor device fabrication processes typically include ion implantation procedures that require performance/implantation at specific angles. As stated supra, the process disk 404 is rotatable about an alpha axis 410 and the beta axis 412 that may be related to the twist and tilt of the wafer, respectively. This property permits a wafer to be implanted at a controlled angle by modifying alpha and beta angles, associated with the alpha axis 410 and the beta axis 412, respectively. Prior to performing an ion implantation process, the process disk 404 can be calibrated, generally for alpha and beta angles of zero that represent a beam normal to the workpiece. A number of suitable mechanisms can be employed to perform this calibration.

One suitable mechanism is to perform a number of ion implants on a set of test wafers and compare the actual implants to expected implants. A series of implants at a number of varied alpha and beta angles are performed on the test wafers in order to identify and/or correct angular error. The test wafers are special grade wafers specifically developed (e.g., from the same crystal boule) for testing and cannot be later used to fabricate semiconductor devices. As a result, this mechanism of calibration can be expensive in terms of time and materials. The depth of the implant as well as other characteristics and/or features that vary with implant depth and position of features such as channeling features can be measured and/or otherwise obtained. These measurements, once obtained for the varied alpha and beta angles, can be compared against each other and expected/desired results to determine if a calibration and/or angular error is present. A number of suitable measurement techniques can be employed to measure these features. One is to directly measure the implant features via a scanning electron microscope, scatterometry, ellipsometry, reflectometry and the like. Another is to measure sheet resistance, which varies with implant depth for a given dose. Other suitable techniques can also be employed. The obtained measurements are compared with expected results to determine if there exists a calibration error, also referred to as an angular error, and if so, determines alpha and beta calibration factors that can then be applied to calibrate alpha and beta values of zero. Subsequently, a verification test can be performed to verify that the calibration was appropriate. If the verification fails, another calibration is then performed, and so on until satisfactory calibration is achieved.

Another suitable mechanism is to employ the slot arrays 422 in order to calibrate the process disk 404. The slot arrays 422 have an aspect ratio selected to facilitate accuracy and signal to noise ratio.

Subsequent to calibration, an ion implantation process can be performed. If test wafers were employed for calibration, the process wafers are now inserted onto the process disk 404; otherwise the process wafers are already in place. Once the ion implantation process has begun, the measurements from the slot arrays 422 provide feedback data. From this feedback data, measured charge/current for positive and negative directions can be employed to determine an angle of incidence along an axis, such as 420. This determined angle of incidence value can then be compared to an expected or desired angle of incidence value. If variations exist, adjustments and/or corrections can be performed during ion implantation without halting the implantation process.

Figure 5:
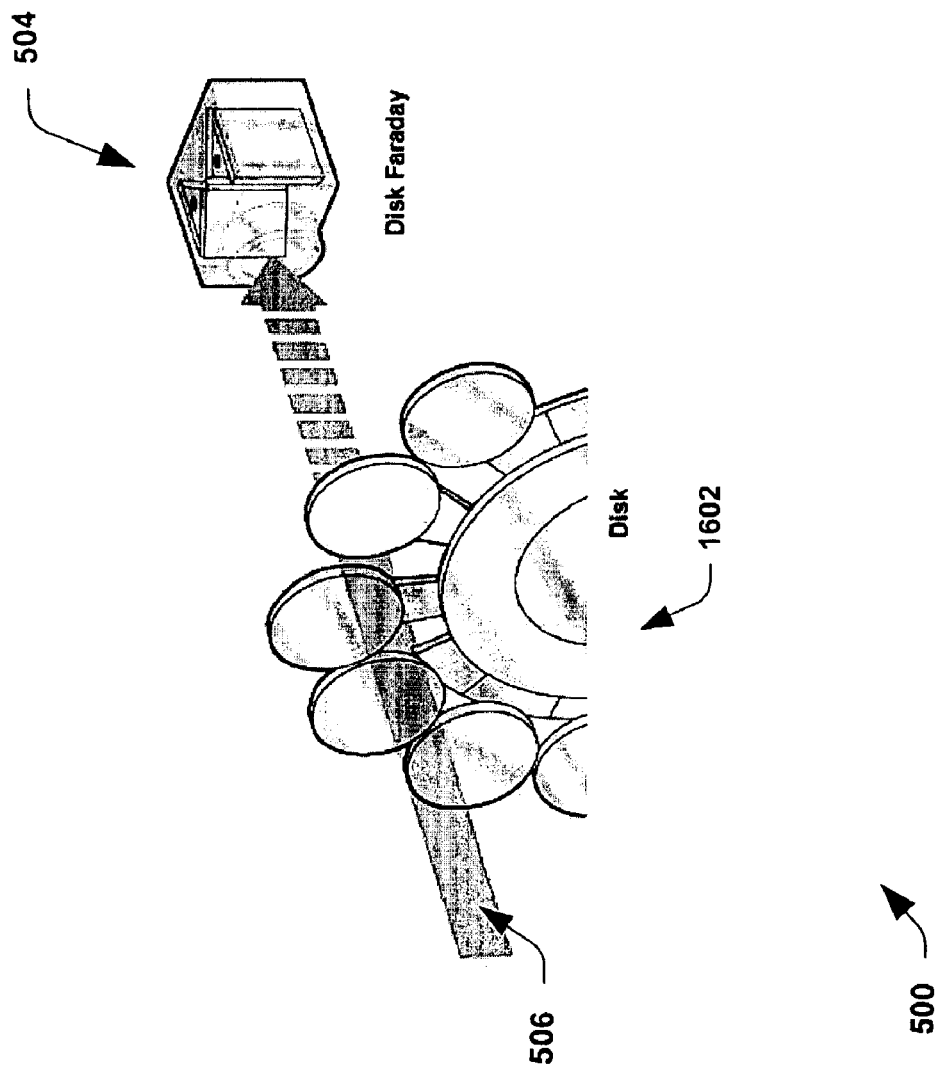
FIG. 5 is a diagram illustrating a perspective view of an end station for an ion implantation system in accordance with an aspect of the present invention.

FIG. 5 is a diagram illustrating a perspective view of an end station 500 for an ion implantation system in accordance with an aspect of the present invention. The end station 500 permits and performs substantially accurate ion implantation procedures therein facilitating semiconductor device fabrication.

The end station 500 includes a process disk 502 and a disk faraday 504. The process disk 502 holds a plurality of wafers (e.g., test wafers, process wafers, and the like) and rotates with a selected rotational speed. The process disk 502 includes a number of slot arrays or asymmetric masks, such as described above, that permit beamlets from an ion beam 506 having a selected range of angles and direction to pass there through. The disk faraday 504, such as a triple surface disk faraday, is located behind the process disk 504 and measures beam current for the beamlets. The beam current measured is based on charged ions that pass through the slot arrays as described above.

The disk faraday 504 is stationary or alternatively may rotate with the process disk and can be employed for dosage control during or prior to performing an ion implantation procedure. Additionally, the faraday 504 can be employed to measure beam current through one or more angle detectors in accordance with the present invention. It is noted that aspects of the present invention can include other charge measurement devices instead of or in place of the disk faraday 504.

Figure 6:
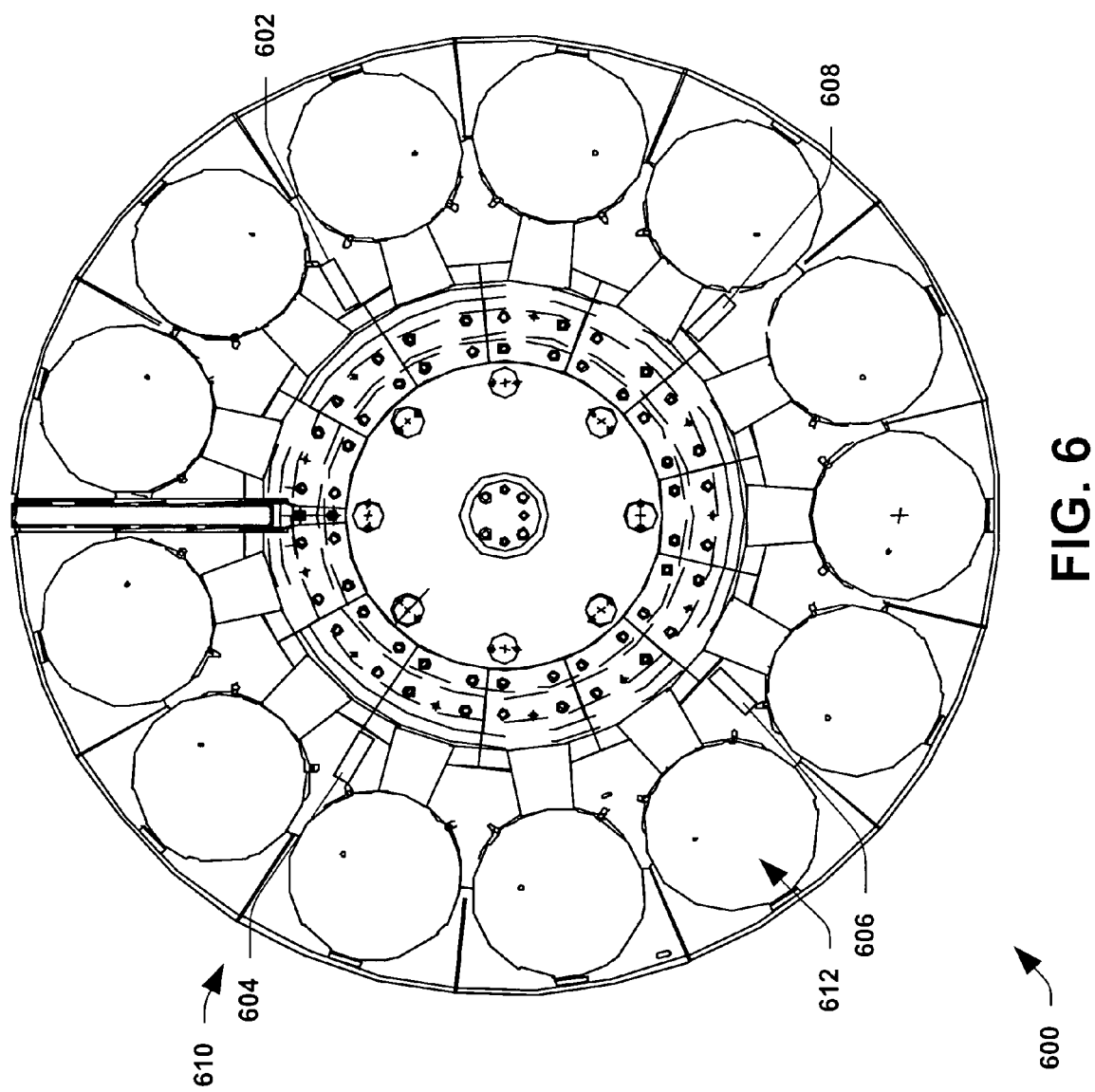
FIG. 6 is a plan view of a configuration of slot arrays on a process disk in accordance with an aspect of the present invention.

Turning now to FIG. 6, a plan view of a configuration of slot arrays on a process disk 600 in accordance with an aspect of the present invention is illustrated. The slot arrays, also referred to as asymmetric masks, permit portions of an incident ion beam to pass there through and be measured according to angle content and direction.

In the configuration illustrated, a first slot array 602, a second slot array 604, a third slot array 606, and a fourth slot array 608 are located within a scan-able range of an ion implantation area for process wafers on a process disk 610. As an example, the first slot array 602 and the third slot array 606 can be designated as positive, which means that they permit portions of the incident ion beam within a range of selected angles in a positive direction to pass there through. Continuing the example, the second slot array 604 and the fourth slot array 608 can be designated as negative, which means that the permit portions of the ion beam within a range of selected angles and in a negative direction to pass there through.

Beam current measurements are obtained for portions of the ion beam that pass through the slot arrays to obtain directional beam current measurements. In the above example, the first slot array 602 and the third slot array 606 provide positive angle beam current measurements and the second slot array 604 and the fourth slot array 608 provide negative angle beam current measurements.

The beam current measurements can then be compared to determine an actual angle of incidence value and direction of that angle. If the ion beam is normal to the process disk 600, the negative and positive angle beam current measurements should be substantially equal. If they are not, the direction of the angle offset is positive if the positive angle beam current is higher than the negative angle beam current and negative if the negative angle beam current is higher than the positive angle beam current.

It is noted that the configuration shown in FIG. 6 is intended only as an example of many possible configurations in accordance with aspects of the present invention. For example, other suitable configurations may employ only a single slot array to obtain positive angle beam current and a single slot array to obtain negative angle beam current. Additionally, other aspects of the invention can employ multiple slots to detects positive and negative angle beam currents in both horizontal and vertical (alpha and beta) directions.

Figure 7A:
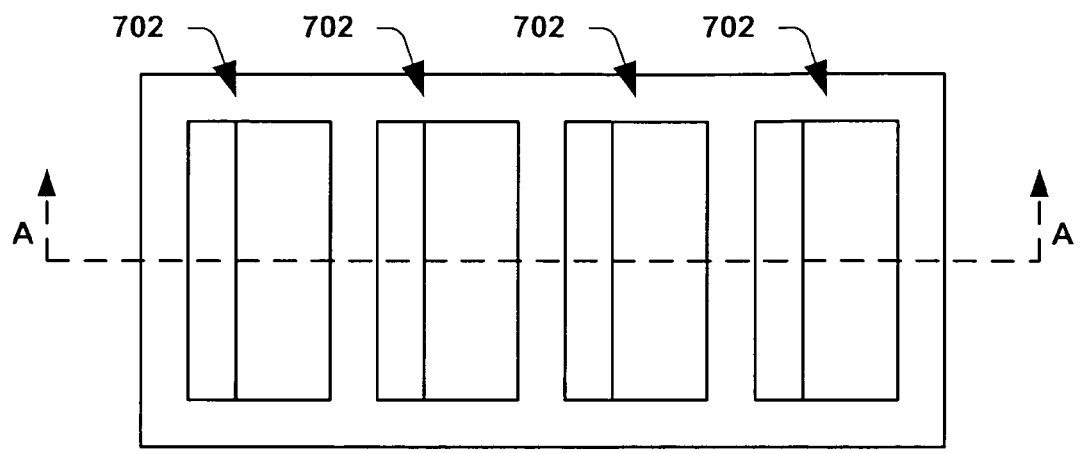
FIG. 7A is a top view of the exemplary slot array in accordance with an aspect of the present invention.
Figure 7B:
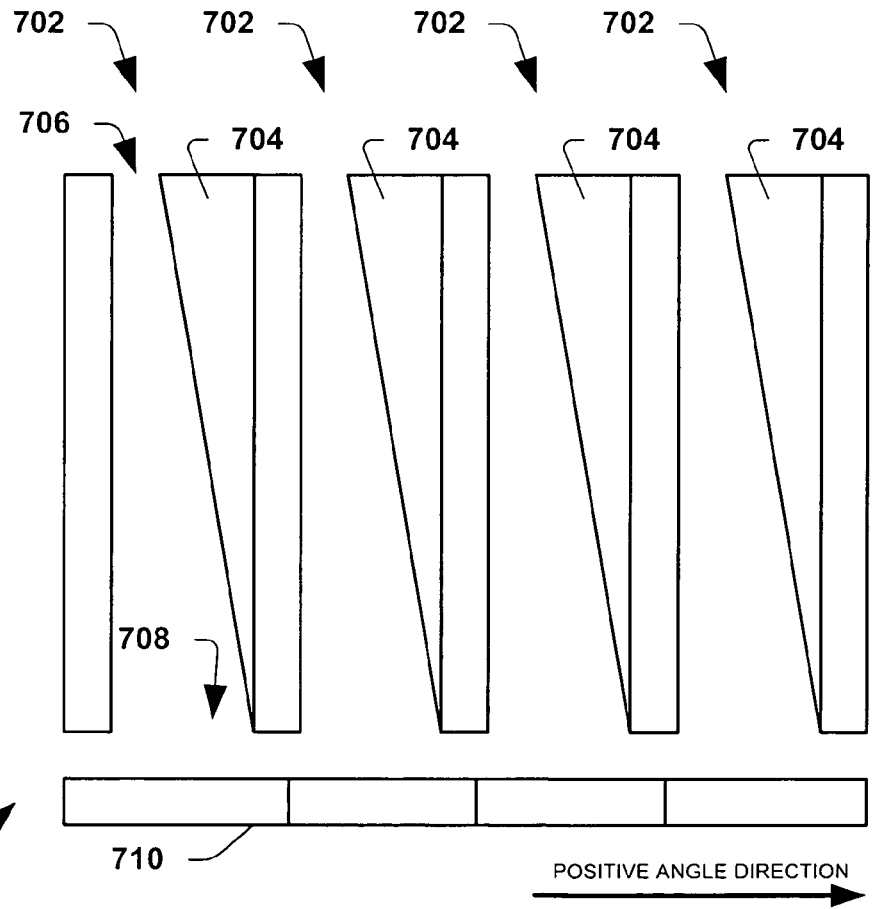
FIG. 7B is a cross sectional view of an exemplary slot array along the A-A line of FIG. 7A.

FIGS. 7A and 7B illustrate an exemplary slot array structure 700 in accordance with an aspect of the invention. The slot array 700, also referred to as an asymmetric mask, yields beamlets of an incident ion beam according to a selected range of angles in a positive direction. The slot array 700 can be employed in single or batch ion implantation systems.

FIG. 7A is a top view of the exemplary slot array 700 in accordance with an aspect of the present invention. The slot array 700 is seen from the view of an incident ion beam. The slot array 700 includes a number of individual slots 702 formed in the slot array 700. Although the view depicts four slots, the present invention contemplates any suitable number of slots within a slot array. Shading is employed to indicate portions of the slots 702 that block passage of ions.

FIG. 7B is a cross sectional view of the exemplary slot array 700 along the A-A line of FIG. 7A. Here, the slot array 700 is again shown with a number of slots 702 formed therein. The slots 702 are defined in part by a beam discriminating structure 704 and have an entrance opening 706 and an exit opening 708 through which portions or beamlets of the ion beam pass.

Measurement devices 710 are positioned below or downstream from the slot array 700. The measurement devices 710 measure charge or beam current for beamlets that have the selected range of angles in the positive direction and that pass through the slots 702. The measured beam current can then be employed, for example, to determine angles of incidence, including average, for the incident ion beam.

Figure 8A:
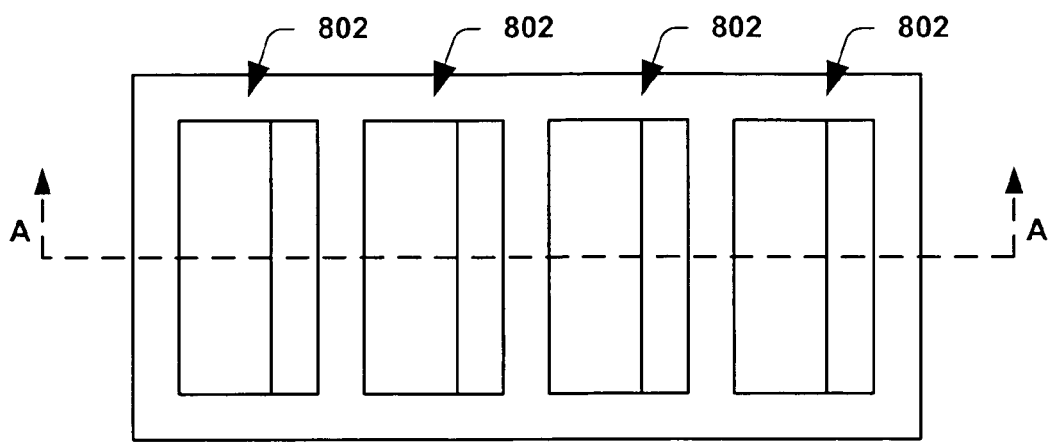
FIG. 8A is a top view of an exemplary slot array in accordance with an aspect of the present invention.
Figure 8B:
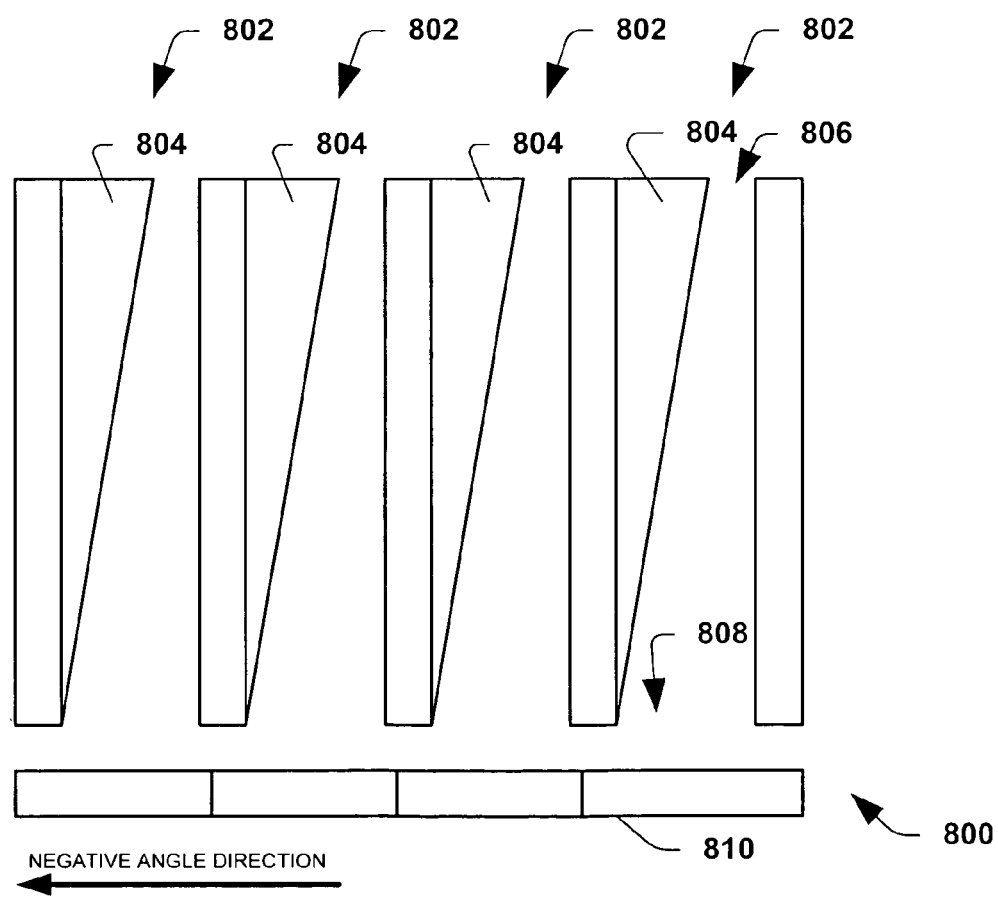
FIG. 8B is a cross sectional view of an exemplary slot array along the A-A line of FIG. 8A.

FIGS. 8A and 8B illustrate an exemplary slot array structure 800 in accordance with an aspect of the invention, but for a negative direction. The slot array 800, also referred to as an asymmetric mask, yields beamlets of an incident ion beam according to a selected range of angles in a negative direction, opposite that of the positive direction describe above with respect to FIGS. 7A and 7B. The slot array 800 can be employed in single or batch ion implantation systems.

FIG. 8A is a top view of the exemplary slot array 800 in accordance with an aspect of the present invention. The slot array 800 is seen from the view of an incident ion beam. The slot array 800 includes a number of individual slots 802 formed in the slot array 800. Although the view depicts four slots, the present invention contemplates any suitable number of slots within a slot array, including a single slot within the array 800. Shading is employed to indicate portions of the slots 802 that block passage of ions.

FIG. 8B is a cross sectional view of the exemplary slot array 800 along the A-A line of FIG. 8A. Here, the slot array 800 is again shown with a number of slots 802 formed therein. The slots 802 are defined in part by a beam discriminating structure 804 and have an entrance opening 806 and an exit opening 808 through which portions or beamlets of the ion beam pass.

Measurement devices 810 are positioned below or downstream from the slot array 800. The measurement devices 810 measure charge or beam current for beamlets that have the selected range of angles in the negative direction and that pass through the slots 802. The measured beam current can then be employed, for example, to determine angles of incidence, including average, for the incident ion beam.

Figure 9A:
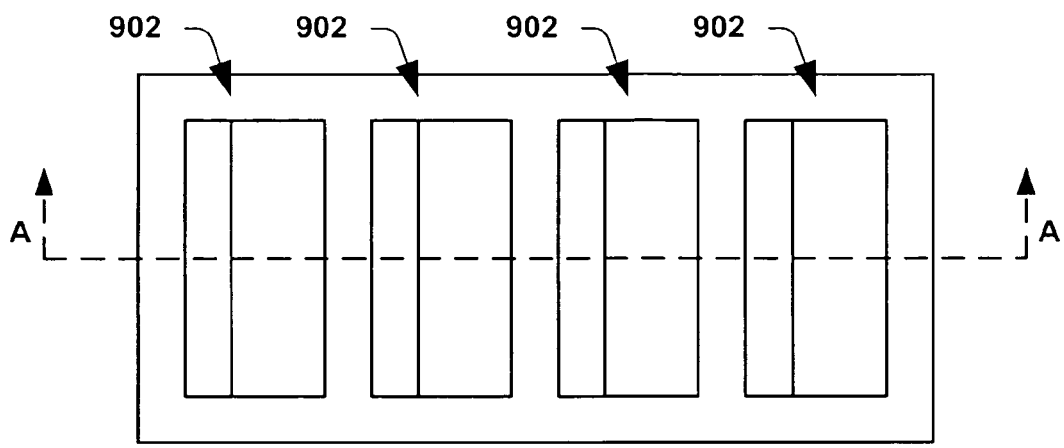
FIG. 9A is a top view of an exemplary slot array in accordance with an aspect of the present invention.
Figure 9B:
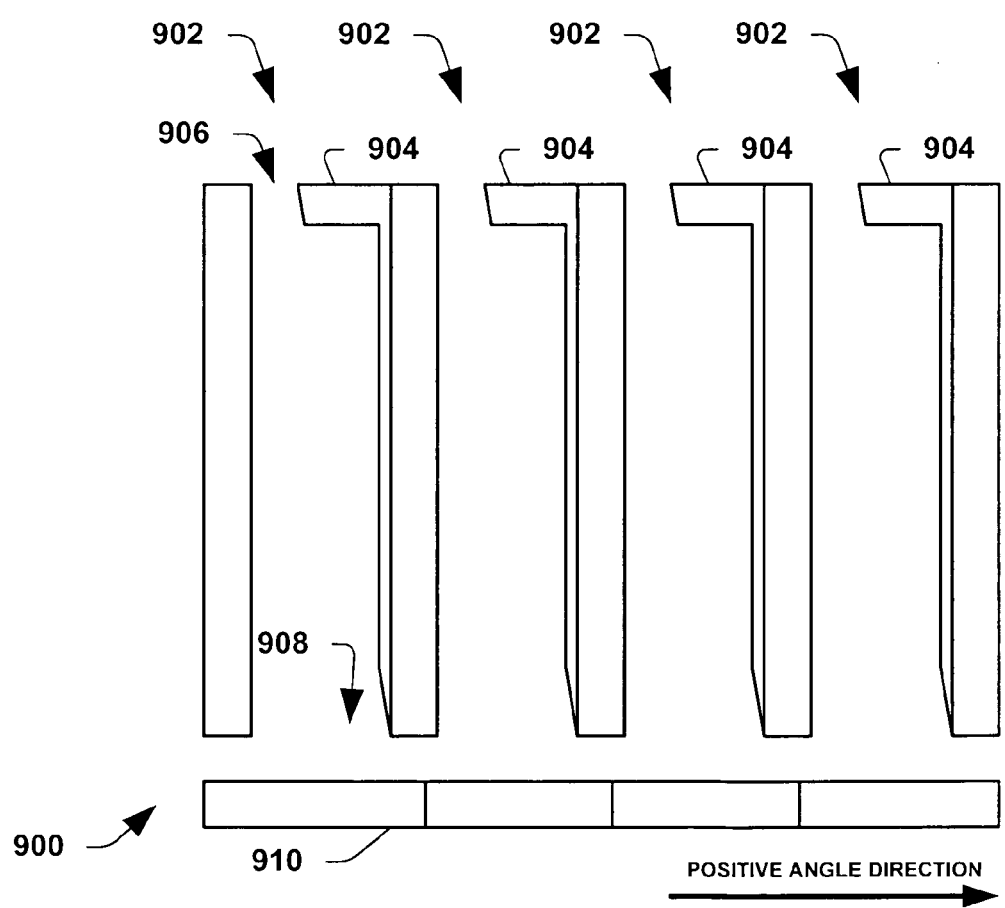
FIG. 9B is a cross sectional view of an exemplary slot array along the A-A line of FIG. 9A.

FIGS. 9A and 9B illustrate yet another exemplary slot array structure 900 in accordance with an aspect of the invention. The slot array 900, also referred to as an asymmetric mask, yields beamlets of an incident ion beam according to a selected range of angles in a positive direction. The slot array 900 can be employed in single or batch ion implantation systems. The slot array 900 provides the same positive angle selection as the slot array 700 of FIGS. 7A and 7B, but with a different structure.

FIG. 9A is a top view of the exemplary slot array 900 in accordance with an aspect of the present invention. The slot array 900 is seen from the view of an incident ion beam. The slot array 900 includes a number of individual slots 902 formed in the slot array 900. Although the view depicts four slots, the present invention contemplates any suitable number of slots within a slot array. Shading is employed to indicate portions of the slots 902 that block passage of ions.

FIG. 9B is a cross sectional view of the exemplary slot array 900 along the A-A line of FIG. 9A. Here, the slot array 900 is again shown with a number of slots 902 formed therein. The slots 902 are defined in part by a beam discriminating structure 904 and have an entrance opening 906 and an exit opening 908 through which portions or beamlets of the ion beam pass. The beam discriminating structure 904 defines a different shape for the slot 902. However, the entrance opening 906 and exit opening 908 yield the same angle discriminating properties as the slot 702 of FIGS. 7A and 7B. Measurement devices 910 are positioned below or downstream from the slot array 900.

Figure 10:
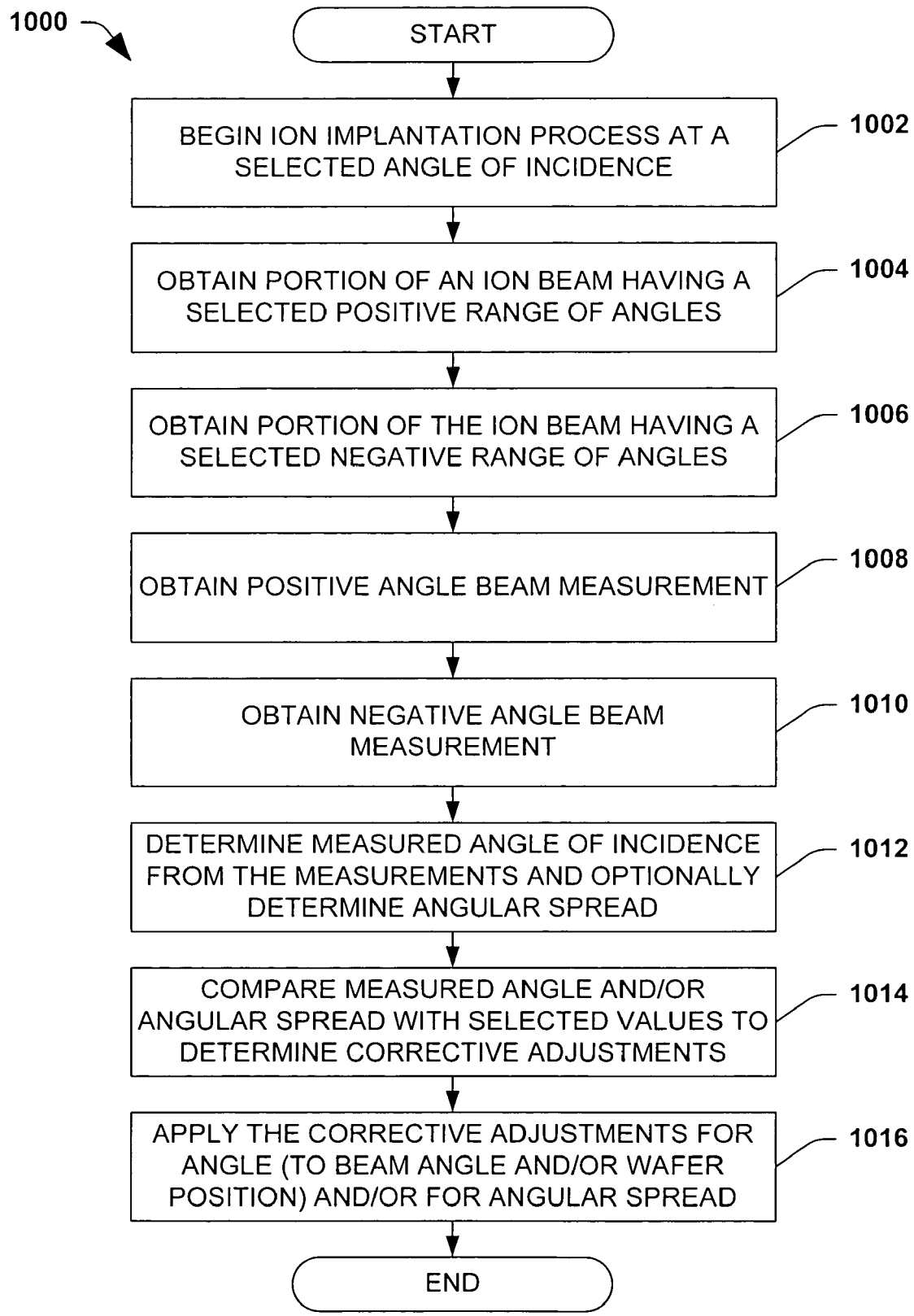
FIG. 10 is a flow diagram illustrating a method of obtaining angle of incidence values in accordance with an aspect of the present invention.

FIG. 10 is a flow diagram illustrating a method 1000 of obtaining angle of incidence values in accordance with an aspect of the present invention. The method 1000 can be employed for calibration and testing or to perform corrective adjustments during ion implantation processes. The method 1000 is described with respect to determining angle of incidence value(s) with respect to a single axis or direction, but can be extended to multiple axes. For example, the method 1000 can be employed to obtain angle of incidence values in a fast scan axis, and/or a slow scan axis. Additionally, the method 1000 can be employed in single and/or batch ion implantation systems.

The method begins at block 1002, wherein an ion implantation process is initiated in which an ion beam having a selected angle of incidence value is directed toward a target. The ion implantation process includes any number of suitable ions or dopants employing in ion implantation processes. The ion beam is generated with a selected energy and dopant concentration, for example, according to a particular fabrication process. The selected angle of incidence is typically within an operational range of the ion implantation system employed. As an example, the selected angle of incidence can be selected according to a particular fabrication process or a calibration procedure. The target can be a target wafer, such as a product wafer or test wafer, or other target for calibration purposes.

A positive slot array or positive asymmetric mask is provided that lies along the path of the incident ion beam, typically near the target at block 1004. The positive slot array obtains at block 1004 portion(s) of the ion beam having a selected range of angles in a positive direction, such as in a positive direction along a fast scan axis. The positive slot array comprises one or more slots, such as described in the figures above, which have entrance openings, exit openings, slot profiles, and aspect rations.

A negative slot array or negative asymmetric mask is provided that lies along the path of the incident ion beam, typically near the target at block 1006. The negative slot array obtains at block 1006 portion(s) of the ion beam having a selected range of angles in a negative direction, such as in a negative direction along a fast scan axis. The negative slot array comprises one or more slots, such as described in the figures above, which have entrance openings, exit openings, slot profiles, and aspect rations.

A positive beam measurement is obtained from the positive portion of the ion beam at block 1008. The positive beam measurement is obtained by employing a beam measurement device, such as a faraday cup downstream of the positive slot array. The positive beam measurement can include one or more individual measurements.

Similarly, a negative beam measurement is obtained from the negative portion of the ion beam at block 1010. The negative beam measurement is obtained by employing the beam measurement device, or another beam measurement device located downstream of the negative slot array. The negative beam measurement can include one or more individual measurements.

The positive and negative beam measurements are employed at block 1012 to determine a measured angle of incidence. The positive beam measurement yields beam current in the positive direction and the negative beam measurement yields beam current in the negative direction. As a result, comparing both indicates which direction, positive or negative, an ion beam is. By employing characteristics of the positive and negative slot arrays, such as aspect ratio, acceptance angle, and the like, a measured angle of incidence value can be determined. The measured angle of incidence can, for example, be an average or median value.

Once the average angle has been determined, the angular spread can be estimated, for example, by looking at current in one slot divided by the total current. If all the currents through the positive slots are summed, and the same with the incident currents, then once the entire beam average angle has been determined, the beam angular spread can be estimated.

The measured angle of incidence is compared with the selected angle of incidence at block 1014 to determine one or more corrective adjustments, if necessary, for the ion implantation process. For example, if the measured angle of incidence is 1.5 degrees and the selected angle of incidence yields 2.5 degrees, an adjustment, such as in the tilt axis and/or twist axis of a batch process system can be performed. Additionally, the measured angular spread can be compared or analyzed with suitable angular spread values to determine corrective adjustments for the ion beam with respect to the angular spread.

The corrected adjustments are applied at block 1016. This can involve adjusting, for example, a tilt angle of a process disk are adjusting an outgoing angle of the ion implantation system. Additionally, the adjustments can be verified by again measuring the positive and negative direction beam currents as above to determine a new measured angle of incidence and to determine if it is close enough to the selected angle of incidence. Also, corrective adjustments for angular spread can be performed on the ion beam.

It is appreciated that the method 1000, as well as variations thereof, can be further appreciated with reference to other figures of the present invention. Additionally, the method 1000 and description thereof can also be employed to facilitate a better understanding of other aspects of the invention described above.

While, for purposes of simplicity of explanation, the method 1000 is depicted and described as executing serially, it is to be understood and appreciated that the present invention is not limited by the illustrated order, as some aspects could, in accordance with the present invention, occur in different orders and/or concurrently with other aspects from that depicted and described herein. For example, the negative beam measurement obtained at block 1010 can occur prior to the positive beam measurement obtained at block 1008. Moreover, not all illustrated features may be required to implement a methodology in accordance with an aspect the present invention.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Also, it is noted that the term exemplary as used herein is to be interpreted only as an example. Furthermore, to the extent that the terms "including", "includes", "having", "has", "with", or variants thereof are used in either the detailed description and the claims, such terms are intended to be inclusive in a manner similar to the term "comprising."

What is claimed is:

1. An ion implantation system comprising: an ion source that generates an ion beam; a beam line assembly that receives the ion beam from the ion source and processes the ion beam; and an angle detector that receives the ion beam from the beam line assembly comprising: a first unitary structure having a slot there through, the slot comprising an entrance opening, an exit opening, and a slot profile between the entrance opening and the exit opening forming a blocking angle, wherein the entrance opening and the exit opening have different shapes or different dimensions with respect to one another, and/or the slot profile has a shape according to a selected range of angles in a first direction, wherein the slot selectively passes through a portion of the ion beam according to the selected range of angles in the first direction; and a first sensor mechanism that receives the portion of the ion beam that passes through the first unitary structure exit opening and obtains a beam current measurement of the portion.

2. The system of claim 1, further comprising an end station located downstream of the beam line assembly, that holds a target wafer.

3. The system of claim 2, wherein the end station further comprises a process disk onto which the structure of the angle detector is mounted.

4. The system of claim 2, wherein the end station is a single wafer end station.

5. The system of claim 1, wherein the slot profile is triangular shaped.

6. The system of claim 1, wherein the entrance opening is larger than the exit opening.

7. The system of claim 1, wherein the exit opening is larger than the entrance opening.

8. The system of claim 1, wherein the angle detector further comprises:
a second unitary structure having a second slot there through, the second slot comprising an entrance opening, an exit opening, and a slot profile between the entrance opening and the exit opening, wherein the entrance opening and the exit opening have different shapes or different dimensions with respect to one another and/or the slot profile has a shape according to a selected range of angles in a second direction opposite the first direction, wherein the second slot selectively passes through a second portion of the ion beam according to the selected range of angles in the second direction; and
a second sensor mechanism that receives the second portion of the ion beam that passes through the second unitary structure exit opening and obtains a second beam current measurement of the second portion of the ion beam.

9. The system of claim 8, further comprising an analyzer component that obtains the beam current measurement from the sensor mechanism and the second beam current measurement from the second sensor mechanism and determines a measured angle of incidence of the incident ion beam at least partially from the first beam current measurement and the second beam current measurement.

10. The system of claim 9, wherein the beam line assembly adjusts an angle of incidence of the ion beam with respect to the target location according to a selected angle of incidence.

11. The system of claim 10, wherein the measured angle of incidence is about equal to the selected angle of incidence.

12. An ion beam angle detector for ion implantation systems comprising: a first unitary structure having a slot there through, the slot comprising an entrance opening, an exit opening, and a slot profile between the entrance opening and the exit opening forming a blocking angle, wherein the entrance opening and the exit opening have different shapes or different dimensions with respect to one another, and/or the slot profile has a shape according to a selected range of angles, in a first direction, wherein the slot selectively passes through a portion of the ion beam according to the selected range of angles in the first direction; and a first sensor mechanism configured to receive the passed portion of the ion beam that passes through the first unitary structure exit opening and measure beam current of the portion of the ion beam.

13. The angle detector of claim 12, wherein the sensor mechanism comprises a charge collector.

14. The angle detector of claim 12, wherein the structure is comprised of a conductive material and is connected to ground.

15. The angle detector of claim 12, wherein the structure is comprised of a material selected from the group consisting of aluminum, aluminum coated with silicon, graphite and anodized aluminum.

16. The angle detector of claim 12, wherein slot has an aspect ratio that yields a suitable signal to noise ratio.

17. The angle detector of claim 12, further comprising:

a second unitary structure having a second slot there through, the second slot comprising an entrance opening, an exit opening, and a slot profile between the entrance opening and the exit opening, wherein the entrance opening and the exit opening have different shapes or different dimensions with respect to one another, and/or the slot profile has a shape according to a selected range of angles in a second direction opposite the first direction, wherein the second slot selectively passes through a second portion of the ion beam according to the selected range of angles in the second direction; and a second sensor mechanism configured to receive and measure beam current of the second portion of the ion beam that passes through the second unitary structure exit opening.

18. A method of obtaining a measured angle of incidence, the method comprising:

obtaining a positive portion of an incident ion beam having a selected range of angles in a positive direction along a first axis of ion implantation using a first unitary structure;

obtaining a negative portion of the incident ion beam having the selected range of angles in a negative direction along the first axis using a second unitary structure that is different than the first unitary structure;

measuring the positive portion with a rotationally fixed sensor to obtain a positive angle beam current measurement;

measuring the negative portion with the rotationally fixed sensor to obtain a negative angle beam current measurement; and determining the measured angle of incidence according to the positive angle beam current measurement and the negative angle beam current measurement.

19. The method of claim 18, wherein obtaining the positive portion of the incident ion beam comprises providing a positive slot array that lies along a path of the incident ion beam and comprises one or more slots having entrance openings and exit openings according to the selected range of angles in the positive direction.

20. The method of claim 18, further comprising determining corrective adjustment values according to the measured angle of incidence and a desired angle of incidence.

21. The method of claim 18, further comprising:

obtaining a second positive portion of the incident ion beam having a second selected range of angles in a positive direction along a second axis of the ion implantation;

obtaining a second negative portion of the incident ion beam having the second selected range of angles in a negative direction along the second axis;

measuring the second positive portion to obtain a second positive angle beam current measurement;

measuring the second negative portion to obtain a second negative angle beam current measurement; and determining a second measured angle of incidence according to the second positive angle beam current measurement and the second negative angle beam current measurement.

22. The method of claim 18, further comprising determining a measured angular spread of the incident ion beam according to the measured angle of incidence.

23. The method of claim 22, further comprising altering an angular spread of the incident ion beam according to the measured angular spread.

* * * * *